(12) United States Patent
Chen et al.

(10) Patent No.: US 7,674,008 B2
(45) Date of Patent: Mar. 9, 2010

(54) LIGHT EMITTING DEVICE AND PANEL

(75) Inventors: Chih-Kuang Chen, Kaohsiung (TW); Ci-Guang Peng, Chiayi (TW)

(73) Assignee: AU Optronics Corporation, Hsinchu (TW)

( * ) Notice: Subject to any disclaimer, the term of this patent is extended or adjusted under 35 U.S.C. 154(b) by 95 days.

(21) Appl. No.: 11/584,374

(22) Filed: Oct. 19, 2006

(65) Prior Publication Data

US 2008/0094833 A1  Apr. 24, 2008

(51) Int. Cl.
*F21V 5/00* (2006.01)
(52) U.S. Cl. .............. 362/244; 362/240; 362/231; 362/97
(58) Field of Classification Search .......... 362/244, 362/800, 97, 330, 97.3, 249.02, 255, 256, 362/326, 335
See application file for complete search history.

(56) References Cited

U.S. PATENT DOCUMENTS 6,086,220 A *  7/2000  Lash et al. .............. 362/244
6,479,942 B2 * 11/2002  Kimura .................. 315/169.3
2002/0003711 A1 *  1/2002  Hashimoto et al. ......... 362/551
2005/0201101 A1 *  9/2005  Shimura ................... 362/330
2006/0034097 A1 *  2/2006  Hahm et al. .............. 362/555
2006/0285311 A1 * 12/2006  Chang et al. ............. 362/97
2007/0030676 A1 *  2/2007  Ichihara .................. 362/244

FOREIGN PATENT DOCUMENTS

CN         1102467      5/1995
WO    WO2006/132046   12/2006

* cited by examiner

*Primary Examiner*—Sandra L O'Shea
*Assistant Examiner*—Jessica L McMillan
(74) *Attorney, Agent, or Firm*—Ware, Fressola, Van Der Sluys & Adolphson, LLP

(57) ABSTRACT

A back-light source comprises a plurality of light-emitting devices, each light-emitting device having a light-emitting package and a lens surface. In at least some of the light emitting devices, the radius of curvature in one direction of the lens surface is different from the radius of curvature in another direction such that one of the radii of curvature of the lens is greater than the other radius of curvature. In particular, one radius of curvature is equal to or smaller than half the length of the device. The other radius of curvature is equal to or greater than half the length of the device. As such, the lens has different focal lengths in different directions. The light-emitting package can have a plurality of light-emitting sources of a single color or of different colors.

24 Claims, 3 Drawing Sheets

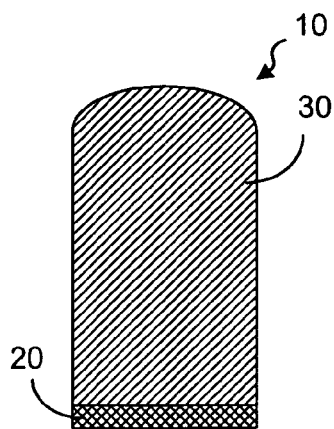
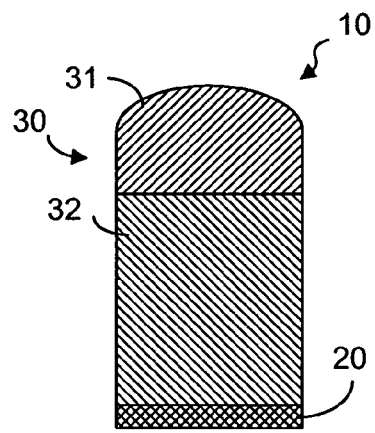
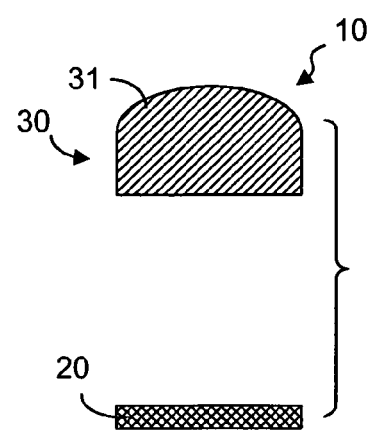
FIG. 4a     FIG. 4b     FIG. 4c
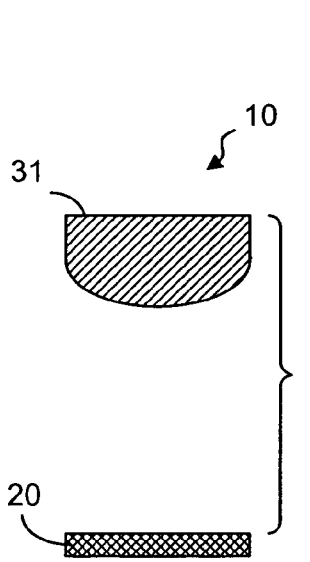
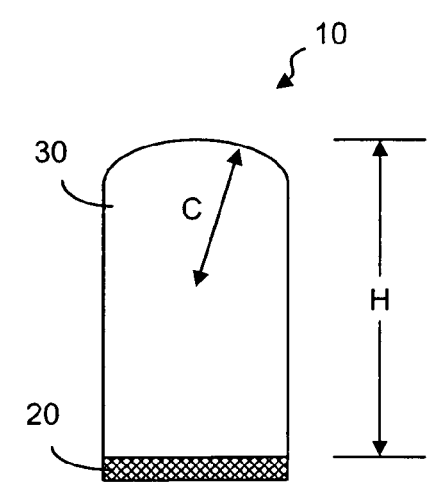
FIG. 4d     FIG. 5
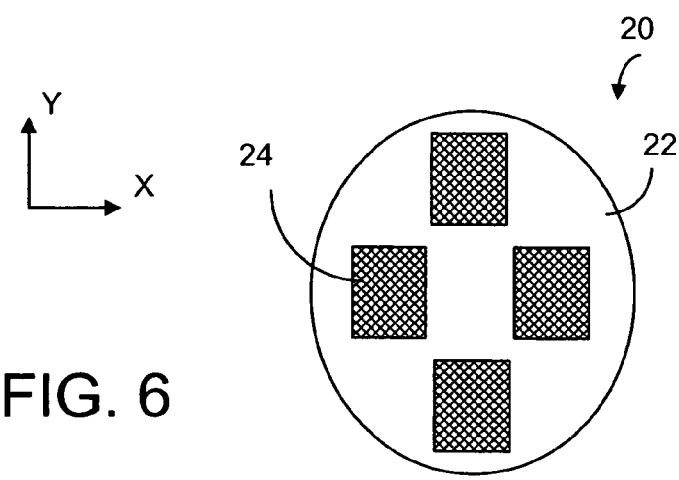
FIG. 6

LIGHT EMITTING DEVICE AND PANEL

FIELD OF THE INVENTION

The present invention relates generally to a light emitting device and, more particularly, to a light emitting device for use in a back-light panel.

BACKGROUND OF THE INVENTION

A transmissive display, such as a transmissive or transflective liquid-crystal display panel, requires a back-light source for illumination. A back-light source, such as a fluorescent light panel or a light-emitting diode panel, has been commonly used. In order to increase the efficiency in providing back-light illumination, lenses or focusing means are also used to direct the light beams from the light source toward the backside of the display panel.

The present invention provides a method and arrangement for directing the light beams produced by the light-emitting devices.

SUMMARY OF THE INVENTION

A back-light source comprises a plurality of light-emitting devices, wherein each of the light-emitting devices has a light-emitting package on one end and a lens surface on the other end to direct a light beam from the light-emitting package through the surface. If the lens surface is substantially spherical, then the focal point is located substantially on the light-emitting package, or the focal length is substantially equal to the distance between the lens surface and the light-emitting package. According to the present invention, the lens surface is not spherical in that the radius of curvature in one direction of the lens surface is different from the radius of curvature in another direction. One of the radii of curvature of the lens is greater than the other radius of curvature. In particular, one radius of curvature is substantially equal to or smaller than half the distance between the lens surface and the light-emitting package. The other radius of curvature is substantially equal to or greater than half the distance between the lens surface and the light-emitting package. As such, the lens has effectively two focal lengths, one is greater than the other causing the lens to focus in one direction on or behind the light-emitting package and to focus in the other direction on or in front of the light-emitting package. The light-emitting package can have a plurality of light-emitting sources of a single white color or of different colors in RGB, for example.

When the back-light source is used for providing back-light illumination to a transmissive or transflective display panel and the display panel is placed in an upright orientation, the light-emitting devices are arranged such that the greater radius of curvature is substantially in a vertical direction and the smaller radius of curvature is substantially in a horizontal direction.

Thus, the first aspect of the present invention is a light-emitting device having a lens for direct light from a light-emitting package, wherein the lens has a lens surface with different radii of curvature along the optical axis. One radius of curvature is greater than the other causing the lens to focus in one direction on or behind the light-emitting package and to focus in the other direction on or in front of the light-emitting package.

The second aspect of the present invention is a back-light source having a two-dimensional array of light emitting devices, wherein at least some of the light emitting devices have a lens surface with different radii of curvature along its optical axis. One radius of curvature is greater than the other radius of curvature. When the light source is placed in an upright orientation, those light-emitting devices are arranged such that the greater radius of curvature is substantially in a vertical direction and the smaller radius of curvature is substantially in a horizontal direction.

The third aspect of the present invention is a display device having a display panel and a back-light source located adjacent to the back side of the display panel for providing illumination to the display panel.

The present invention will become apparent upon reading the description taken in conjunction with FIGS. 1 to 7b.

BRIEF DESCRIPTION OF THE DRAWINGS

FIG. 4a is a cross sectional view of a light-emitting device, according to one embodiment of the present invention.

FIG. 4b is a cross sectional view of a light-emitting device, according to another embodiment of the present invention.

FIG. 4c is a schematic representation of a beam directing arrangement in a light-emitting device, according to a different embodiment of the present invention.

FIG. 4d is a schematic representation of a beam directing arrangement in a light emitting device, according to yet another embodiment of the present invention.

FIG. 5 shows the relationship of the radius of curvature of a focusing lens and the height in a light-emitting device, according to one embodiment of the present invention.

FIG. 6 shows a plurality of light-emitting diodes in a light-emitting package.

DETAILED DESCRIPTION OF THE INVENTION

Figure 1:
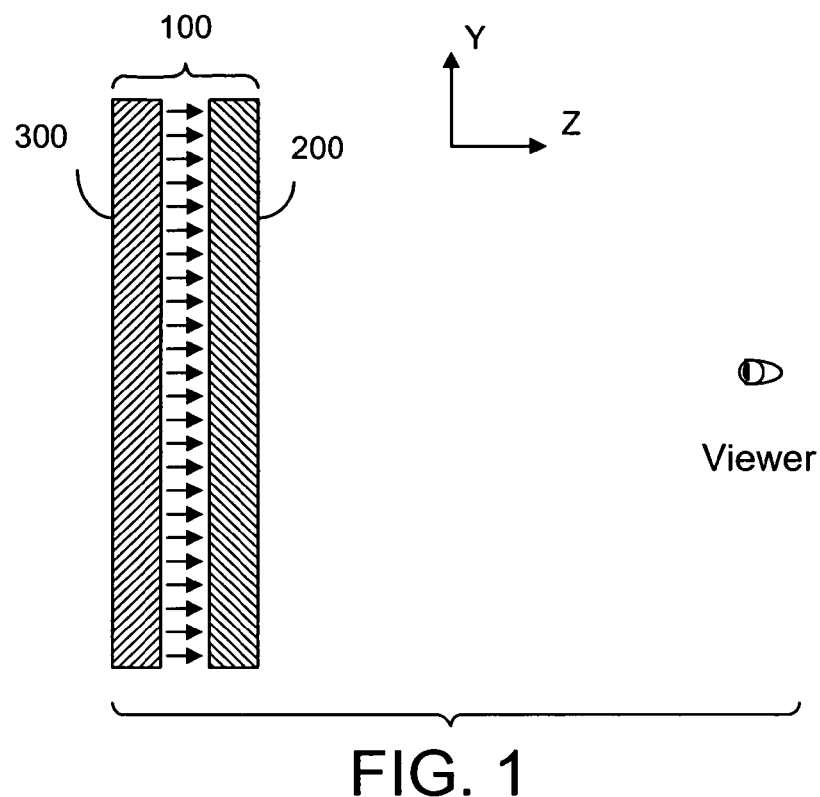
FIG. 1 is a schematic representation of a transmissive or transflective display and a back-light source, wherein the back-light source comprises a plurality of light-emitting device, according to the present invention.
Figure 2:
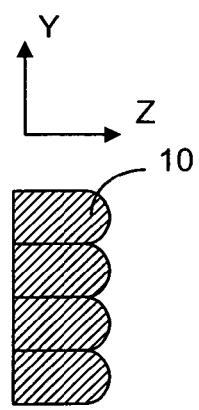
FIG. 2 is a cross sectional view of a plurality of light-emitting devices, at least some of light-emitting devices have the lens surface characteristics of the present invention.
Figure 3A:
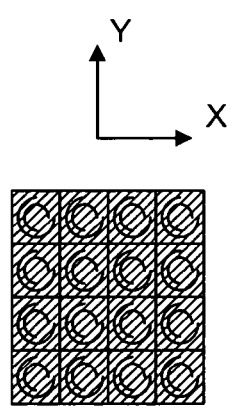
FIG. 3a is a schematic representation of a plurality of light emitting devices, according to one embodiment of the present invention.
Figure 3B:
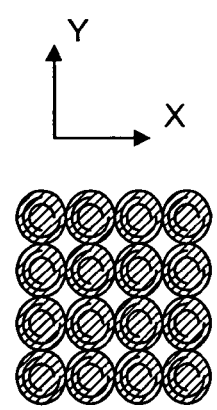
FIG. 3b is a schematic representation of a plurality of light emitting devices, according to another embodiment of the present invention.

The main purpose of placing a back-light source behind a transmissive or transflective display panel, such as a liquid crystal display panel, is to provide illumination to the display panel, allowing a viewer to see a displayed image on the panel. As shown in FIG. 1, a display panel 100 has a display module 200 and a back-light source 300. As shown in FIG. 1, when the display 100 is placed in an upright orientation to allow a viewer to see a displayed image in a regular way, the vertical axis of the display panel is more or less parallel to the Y axis and the horizontal axis is more or less parallel to the X axis (see FIGS. 3a and 3b). The back-light source 300, according to the present invention, comprises a two-dimensional array of light-emitting devices 10, as shown in FIG. 2. The light-emitting device 10 may have a rectangular body as shown in FIG. 3a or a cylindrical body with a circular or elliptical cross section as shown in FIG. 3b. As shown in FIG.

4a to 4c, each light emitting device 10 has a light-emitting package 20 and a light directing element 30 associated with the package 20. The light directing element 30 can be made of an optical material having a curved surface to direct light beams emitted from the light emitting package 20 via refraction. Alternatively, the light directing element 30 comprises a lens section 31 made of one optical material and an intervening section 32 made of a different optical material, as shown in FIG. 4b. The lens section 31 can be a part of a lens sheet having a two dimensional array of such lens sections, and the intervening section 32 can be an air gap, as shown in FIG. 4c. In the lens section as shown in FIG. 4c, the flat surface of each lens section 31 faces the light-emitting package 20. In a different embodiment, the lens sheet is placed such that the curved surface of each lens section faces the light-emitting package 20.

Because of the viewing arrangement of the display panel 100 and the viewing characteristics of the human eyes, it is preferable that the light directing element 30 is optically unsymmetrical about the Z axis. Thus, the radius of curvature of the light directing element 30 in one direction is different from the radius of curvature in another direction. For example, the radius of curvature C in the X direction is different from the radius of curvature in the Y direction (see FIGS. 3a, 3b and 5). As shown in FIG. 5, the light-emitting device 10 has a height H associated with the focusing property of the light-emitting device 10. If H is equal to the focal length of the light directing element 30, then the radius of curvature on the light directing element is approximately equal to H/2 if the refractive index of the light directing element is about 1.5. The light-emitting package 20, as shown in FIG. 6, may comprise a plurality of light-emitting diodes 24 disposed on a substrate 22. The light-emitting diodes can be light sources in different colors of RGB (red, green and blue), for example. Alternatively, the light-emitting package 20 has one or more white-light emitting diodes or modules 24.

Figure 7A:
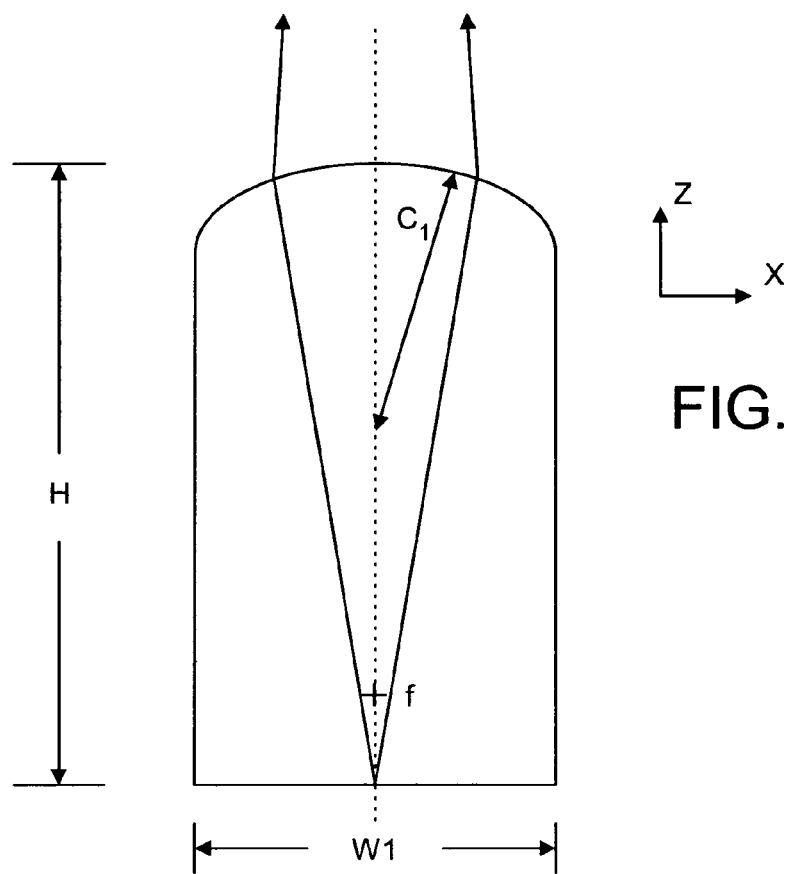
FIG. 7a shows the radius of curvature of a light directing element in one direction.

According to the present invention, it is preferred that the radius of curvature of the light directing element 30 (FIG. 4a) or that of the lens section 31 in one direction is smaller than H/2. For example, the radius of curvature C1 in the X direction (the horizontal direction when the display panel 100 is placed in an upright orientation against a vertical wall) is smaller than H/2. This means that the focal point, f, associated with C1 is shorter than H, as shown in FIG. 7a. As such, a point source on the lower surface of the light directing element 30 will produce a convergent light beam. The radius of curvature C1 can be dimensioned between H/2 and W1/2, or half the width in the X direction. In some extreme cases, it is possible to have the ratio of C1 to the height H being equal to 0.05, for example.

Figure 7B:
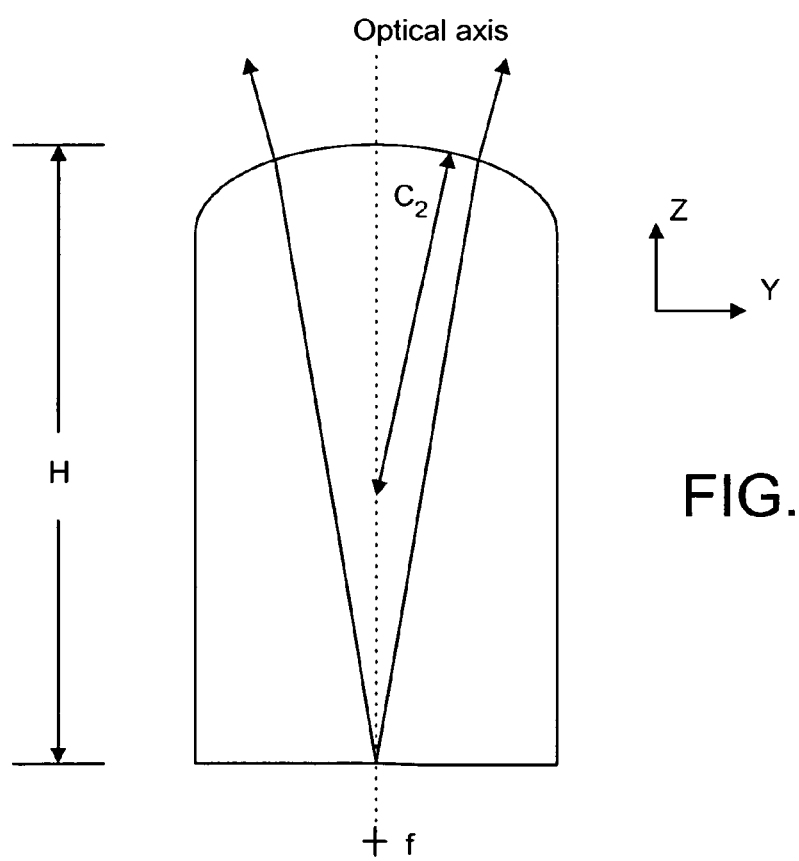
FIG. 7b shows the radius of curvature of the light directing element in another direction.

It is also preferred that the radius of curvature C2 in the Y direction is equal to or greater than H/2. This means that the focal point, f, associated with C2 is located behind the end of the device, as shown in FIG. 7b. As such, a point source on the lower surface of the light directing element 30 will produce a divergent light beam.

In a back-light source 300 for use in a transmissive or transflective display panel, at least some of the light directing elements for directing the light beams provided by the light-emitting packages are not optically symmetrical. When the display panel is placed in an upright position against a vertical wall, for example, the radius curvature of some light directing elements is smaller in the vertical direction than that in the horizontal direction. The light directing elements can be made of individual optical elements integrated to the light-emitting packages. The light directing elements can also be made on a sheet of optical material separated from the light-emitting packages. The light directing element 30 can be made of a plano-convex lens, as shown in FIGS. 4a to 4d. However, the light directing element 30 can be made of a double convex lens, a convex-concave lens or the combination thereof.

Furthermore, in a large display panel, the light-emitting elements in the center of the back-light source are not necessarily the same as those on the left or right section of the back-light source. For example, the light emitting elements 30 on the side sections may have a greater divergent angle than the light emitting elements on the center section. That means that C1 of the light emitting elements 30 on the side sections may be greater than C1 of the light emitting elements 30 on the center section of the back-light source 300. Also, it is possible that the lens surface of the light-emitting elements 30 in the center section of the back-light source is spherical or symmetrical in reference to the optical axis of the light-emitting element. Furthermore, depending on the location of the light emitting elements relative to the center of display panel, the ratio C1/C2 can be ranging from 0.95 to 0.05, for example.

In sum, the present invention provides a back-light source comprising a plurality of light-emitting devices, wherein each of the light-emitting devices has a light-emitting package on one end and a lens surface on the other end to direct a light beam from the light-emitting package through the surface. If the lens surface is substantially spherical, then the focal point is located substantially on the light-emitting package, or the focal length is substantially equal to the distance between the lens surface and the light-emitting package. According to the present invention, the lens surface is not spherical in that the radius of curvature in a direction of the lens surface is different from the radius of curvature in another direction. One of the radii of curvature of the lens is greater than the other radius of curvature. In particular, one radius of curvature is substantially equal to or smaller than half the distance between the lens surface and the light-emitting package. The other radius of curvature is substantially equal to or greater than half the distance between the lens surface and the light-emitting package. As such, the lens has effectively two focal lengths, one is greater than the other causing the lens to focus in one direction on or behind the light-emitting package and to focus in the other direction on or in front of the light-emitting package.

When the back-light source is used for providing back-light illumination to a transmissive or transflective display panel and the display panel is placed in an upright orientation, the light-emitting devices are arranged such that the greater radius of curvature is substantially in a vertical direction and the smaller radius of curvature is substantially in a horizontal direction.

Thus, although the present invention has been described with respect to one or more embodiments thereof, it will be understood by those skilled in the art that the foregoing and various other changes, omissions and deviations in the form and detail thereof may be made without departing from the scope of this invention.

What is claimed is:

1. A back-light source comprising:
   a first surface and an opposing second surface;
   a plurality of light emitting elements, wherein at least some of the light emitting elements comprise:
   a first end located adjacent to the second surface;
   an opposing second end facing the first surface;
   a device body made substantially of an optical material, the device body comprising an optical axis substantially perpendicular to the first surface, a first plane containing the optical axis and a different second plane containing the optical axis; and a light emitting component located at the first end, wherein the device body further comprises a light directing surface at the second end along the optical axis to direct light emitted by the light-emitting component, and wherein the light directing surface has different radii of curvature in different directions such that the radius of curvature in a first plane is greater than the radius of curvature in a second plane so as to provide different focal distances.

2. The back-light source of claim 1, wherein the light-emitting component and the light directing surface is separated by a distance and the radius of curvature in the second plane is substantially equal to or smaller than half said distance.

3. The back-light source of claim 1, wherein the light-emitting component and the light directing surface is separated by a distance and the radius of curvature in the first plane is substantially equal to or greater than half said distance.

4. The back-light source of claim 3, wherein the radius of curvature in the second plane is smaller than half said distance.

5. The back-light source of claim 1, wherein the first plane is substantially parallel to a vertical direction when the back-light source is placed in an upright orientation.

6. The back-light source of claim 1, wherein the light emitting component comprises a plurality of light emitting sources of a single color.

7. The back-light source of claim 6, wherein said single color is substantially a white color.

8. The back-light source of claim 1, wherein the light emitting component comprises a plurality of light emitting sources in a plurality of colors.

9. The back-light source of claim 1, wherein at least some of the light emitting elements are jointed as a group.

10. The back-light source of claim 1, wherein a ratio of the radius of curvature in a second plane to the radius of curvature in a first plane is ranging substantially from 0.95 to 0.05.

11. A display device comprising:
a display panel having a first side for viewing and an opposing second side; and
a back-light source of claim 1, positioned in relationship to the second side of the display panel.

12. The display device of claim 11, wherein the first side comprises a first side surface and the optical axis is substantially perpendicular to the first side surface.

13. The back-light source of claim 1, wherein
the first plane is substantially perpendicular to the second plane.

14. A light-emitting device comprising:
a first end;
an opposing second end;
a light emitting component located at the first end; and
a device body made substantially of an optical material, the device body comprising an optical axis, a first plane containing the optical axis and a second plane containing the optical axis, wherein the device body comprises an elongated first body segment adjacent to the first end, and a second body segment between the first body segment and the second end, and wherein the second body segment has a light directing surface at the second end, wherein the light directing surface has different radii of curvature in different directions such that the radius of curvature in a first plane is greater than the radius of curvature in a second plane so as to provide different focal distances.

15. The light-emitting device of claim 14, wherein the radius of curvature in the second plane is substantially equal to or smaller than half said length.

16. The light-emitting device of claim 14, wherein the radius of curvature in the first plane is substantially equal to or greater than half said length.

17. The light-emitting device of claim 16, wherein the radius of curvature in the second plane is smaller than half said distance.

18. The light-emitting device of claim 14, wherein the light emitting component comprises a plurality of light emitting sources of a single color.

19. The light-emitting device of claim 18, wherein said single color is substantially a white color.

20. The light-emitting device of claim 14, wherein the light emitting component comprises a plurality of light emitting sources in a plurality of colors.

21. The light-emitting device of claim 14, wherein the light emitting device has a width smaller than said length and the radius of curvature in the second plane is dimensioned between half the width and half said length.

22. The light-emitting device of claim 14, wherein a ratio of the radius of curvature in a second plane to the radius of curvature in a first plane is ranging substantially from 0.95 to 0.05.

23. The light emitting device of claim 14, wherein
the first plane is substantially perpendicular to the second plane.

24. The light emitting device of claim 14, wherein the first body segment has a length and a cross section defining a width of the first body segment, and wherein the length is greater than the width.

* * * * *